US010069043B2

(12) United States Patent
Li et al.

(10) Patent No.: US 10,069,043 B2
(45) Date of Patent: Sep. 4, 2018

(54) LED LIGHT EMITTING DEVICE FOR DISPLAY DEVICE, AND DISPLAY DEVICE

(71) Applicants: HISENSE ELECTRIC CO., LTD., Shandong (CN); HISENSE USA CORPORATION, Suwanee, GA (US); HISENSE INTERNATIONAL CO.,LTD., Shandong (CN)

(72) Inventors: Fulin Li, Shandong (CN); Zhicheng Song, Shandong (CN); Kun Shao, Shandong (CN)

(73) Assignees: Hisense Electric Co., Ltd., Shandong (CN); Hisense USA Corporation, Suwanee, GA (US); Hisense International Co., Ltd., Shandong (CN)

( * ) Notice: Subject to any disclaimer, the term of this patent is extended or adjusted under 35 U.S.C. 154(b) by 210 days.

(21) Appl. No.: 14/751,393

(22) Filed: Jun. 26, 2015

(65) Prior Publication Data

US 2016/0204317 A1 Jul. 14, 2016

(30) Foreign Application Priority Data

Jan. 8, 2015 (CN) .......................... 2015 1 0009581

(51) Int. Cl.
*F21V 13/14* (2006.01)
*G02F 1/1335* (2006.01)
(Continued)

(52) U.S. Cl.
CPC .............. *H01L 33/50* (2013.01); *F21V 13/14* (2013.01); *G02F 1/133514* (2013.01);
(Continued)

(58) Field of Classification Search
CPC ....... H01L 33/50; H01L 33/44; H01L 33/483; H01L 33/60; H01L 33/58;
(Continued)

(56) References Cited

U.S. PATENT DOCUMENTS

| | | | | |
|---|---|---|---|---|
| 8,093,610 B2 * | 1/2012 | Wilm | H01L 33/44 | 257/103 |
| 2004/0116033 A1 * | 6/2004 | Ouderkirk | H01L 33/505 | 445/23 |
| 2004/0190304 A1 * | 9/2004 | Sugimoto | F21K 9/00 | 362/555 |
| 2007/0085103 A1 * | 4/2007 | Nishioka | H01L 33/507 | 257/99 |

(Continued)

FOREIGN PATENT DOCUMENTS

CN 102437275 5/2012

*Primary Examiner* — Alexander Garlen
(74) *Attorney, Agent, or Firm* — Hoffman & Baron, LLP

(57) ABSTRACT

Some embodiments of the disclosure provide an LED light emitting device for a display device, and a display device, relate to the field of display technologies. The LED light emitting device includes a quantum dot film, a reflective filter layer, and at least one LED lamp, wherein the quantum dot film is arranged between the at least one LED lamp and the reflective filter layer; the at least one LED lamp is configured to emit light to excite a quantum dot material encapsulated in the quantum dot film to generate white backlight; and the reflective filter layer is configured to reflect light in a preset band and to transmit light outside the preset band, wherein the light in the preset band is light in a part of a band of the light emitted by the at least one LED lamp.

20 Claims, 5 Drawing Sheets

103
104
101
102
10

(51) Int. Cl.

| | |
|---|---|
| ***H01L 33/44*** | (2010.01) |
| ***H01L 33/48*** | (2010.01) |
| ***H01L 33/50*** | (2010.01) |
| ***H01L 33/60*** | (2010.01) |
| *H01L 25/075* | (2006.01) |
| *H01L 33/58* | (2010.01) |

(52) U.S. Cl.
CPC .. *G02F 1/133603* (2013.01); *G02F 1/133605* (2013.01); *H01L 33/44* (2013.01); *H01L 33/483* (2013.01); *H01L 33/60* (2013.01); *G02F 2001/133614* (2013.01); *H01L 25/0753* (2013.01); *H01L 33/58* (2013.01)

(58) Field of Classification Search
CPC ......... G02F 1/133514; G02F 1/133603; G02F 1/133605; F21V 13/14
See application file for complete search history.

(56) References Cited

U.S. PATENT DOCUMENTS

2008/0116473 A1* 5/2008 Sugiyama ............. H01L 33/483 257/98
2011/0199352 A1* 8/2011 Wheatley ............. G02B 6/0035 345/207
2011/0291113 A1 12/2011 Chamberlin
2012/0169791 A1* 7/2012 Whitehead ........ G02F 1/133603 345/690
2013/0270587 A1* 10/2013 Ouderkirk ............... H01L 33/60 257/89
2015/0049486 A1* 2/2015 Jung ......................... F21V 5/04 362/260
2015/0137163 A1* 5/2015 Harris ................... H01L 33/483 257/98

* cited by examiner

LED LIGHT EMITTING DEVICE FOR DISPLAY DEVICE, AND DISPLAY DEVICE

CROSS-REFERENCE TO RELATED APPLICATIONS

This application claims the benefit and priority of Chinese Patent Application No. 201510009581.X filed with the State Intellectual Property Office of People's Republic of China on Jan. 8, 2015, the content of which is incorporated herein by reference in its entirety.

BACKGROUND

The present disclosure relates to the field of display technologies and particularly to an LED light emitting device for a display device, and a display device.

A color gamut which is an index to evaluate a color presentation capability of a liquid crystal display has gained increasing attention of people. In order to achieve a high color gamut as required, such a backlight solution that generates white light by exciting a Quantum Dot (QD) material using a blue Light Emitting Diode (LED) is commonly used, thus resulting in a color gamut up to 100%.

The quantum dot material is an photoluminescence semiconductor in a crystal structure, the color of which is determined by the size thereof. Since the quantum dot material may fail due to high temperature and oxygen, it is common in the prior art to encapsulate the quantum dot material into a film, thus resulting in a quantum dot film applied in a backlight module of a liquid crystal display to improve a color gamut range which may be displayed on the liquid crystal display. In the prior art, the quantum dot material is encapsulated in the quantum dot film, and the LED is arranged below the quantum dot film, so that light emitted by the LED is irradiated onto the quantum dot material in the quantum dot film to thereby excite the quantum dot material to emit light in complementary colors to the light, and then the emitted light in the complementary colors to the light and the light transmitted through the quantum dot film is mixed into white light.

SUMMARY

Some embodiments of the disclosure provide an LED light emitting device for a display device, the LED light emitting device including a quantum dot film, a reflective filter layer, and at least one LED lamp, wherein:

the quantum dot film is arranged between the at least one LED lamp and the reflective filter layer;

the at least one LED lamp is configured to emit light to excite a quantum dot material encapsulated in the quantum dot film to generate white backlight; and the reflective filter layer is configured to reflect light in a preset band and to transmit light outside the preset band, wherein the light in the preset band is light in a part of a band of the light emitted by the at least one LED lamp.

Some embodiments of the disclosure provide a display device including a backlight module including at least one LED light emitting device, the at least one LED light emitting device including a quantum dot film, a reflective filter layer, and at least one LED lamp, wherein:

the quantum dot film is arranged between the at least one LED lamp and the reflective filter layer;

the at least one LED lamp is configured to emit light to excite a quantum dot material encapsulated in the quantum dot film to generate white backlight; and the reflective filter layer is configured to reflect light in a preset band and to transmit light outside the preset band, wherein the light in the preset band is light in a part of a band of the light emitted by the LED lamp.

BRIEF DESCRIPTION OF THE DRAWINGS

In order to make the technical solutions in the embodiments of the disclosure or the prior art more apparent, the drawings to which a description of some of the embodiments of this disclosure or the prior art refers will be briefly introduced below, and apparently the drawings to be described below are merely illustrative of some of the embodiments of the disclosure, and those ordinarily skilled in the art may obtain from these drawings other drawings without any inventive effort. In the drawings.

DETAILED DESCRIPTION

The technical solutions according to some of the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which may occur to those skilled in the art without any inventive effort shall fall into the scope of the disclosure.

In the related art, a quantum dot film is fabricated by including the cadmium in a quantum dot material to improve the light emission efficiency and brightness of the quantum dot material, but the heavy metal cadmium is a highly poisonous substance, so the concentration of the quantum dot material in the quantum dot film has to be lowered. However if the concentration of the quantum dot material in the quantum dot film is low, then there may be a considerable gap between adjacent quantum dot components, and taking a blue LED as an example, light in complementary colors to blue light is red light and green light, and when the blue light emitted by the blue LED passes the quantum dot film, the majority of the blue light may pass the gap between the adjacent quantum dot components, and only the minority of the blue light may excite the quantum dot material to generate red light and green light mixed with the blue light into white light, thus resulting in a low utilization ratio of the blue light. Moreover too much of the blue light is transmitted so that the proportion of the blue light in the white light generated from the mixing is high, and the proportion of the red light and the green light is low, thus making the white light generated from the mixing bluish as a whole, which may degrade the light emission effect of the LED light emitting device.

In view of this, some embodiments of the disclosure provides an LED light emitting device for a display device, and a display device so as to improve both the utilization ratio of light emitted by an LED lamp and the light emission effect of the LED light emitting device.

Figure 1:
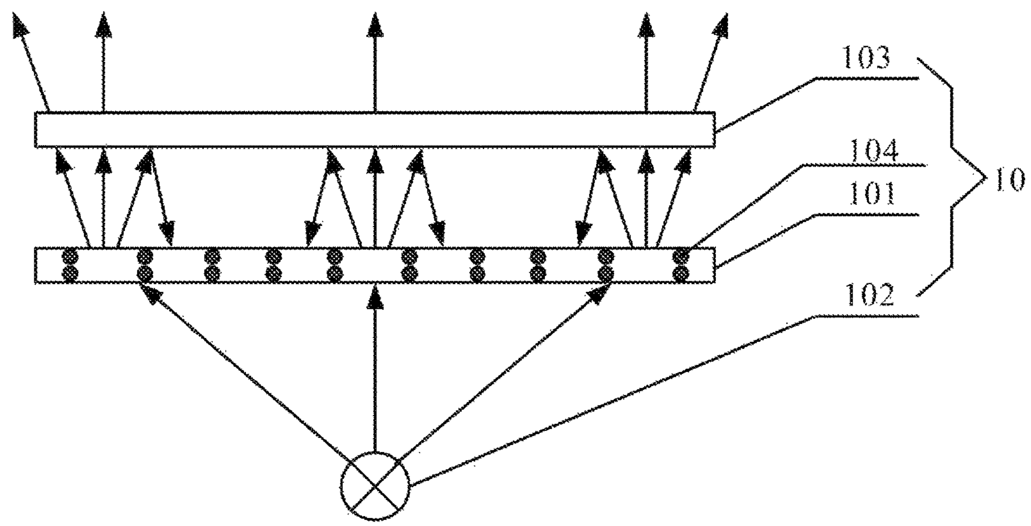
FIG. 1 illustrates a schematic diagram of an LED light emitting device according to some embodiments of the disclosure.

As illustrated in FIG. 1, an LED light emitting device 10 for a display device according to some embodiments of the disclosure may include a quantum dot film 101, a reflective filter layer 103, and at least one LED lamp 102, where the quantum dot film 101 is arranged between the LED lamp 102 and the reflective filter layer 103; the at least one LED lamp 102 is configured to emit light to excite a quantum dot material 104 encapsulated in the quantum dot film 101 to generate white backlight; and the reflective filter layer 103 is configured to reflect light in a preset band and to transmit light outside the preset band, where the light in the preset band is light in a part of a band of the light emitted by the LED lamp 102.

The LED lamp 102 may be a light source emitting light in a number of colors, for example, the LED lamp may be a blue LED or a UV LED or the like, although the embodiment of the disclosure will not be limited thereto. However the reflective filter layer 103 shall correspond to the LED lamp 102, that is, when the LED lamp 102 is a blue LED, the reflective filter layer 103 is a blue reflective filter layer reflecting blue light, which functions to reflect blue light in a part of the band and generally does not reflect but transmits directly light in the remaining band; and when the LED lamp 102 is a UV LED, the reflective filter layer 103 is a UV reflective filter layer reflecting UV light.

By way of an example, when the LED lamp 102 is a blue LED, the reflective filter layer 103 is a blue reflective filter layer, and the reflective filter layer 103 reflects blue light in a preset band. The wavelength of the blue light ranges from 445 nanometers (nm) to 490 nm, so the preset band may be any part of the band of 445 nm to 490 nm. In some embodiments, the preset band may be set to approximately a half of the entire band range of the blue light, for example, the preset band may be 445 nm to 467 nm or 467 nm to 490 nm. When the preset band is 445 nm to 467 nm or 467 nm, the blue light in the band of 467 nm to 490 nm is light outside the preset band, and the blue light at the wavelength ranging from 467 nm to 490 nm among the blue light emitted by the LED lamp will be transmitted through the reflective filter layer 103, and the blue light at the wavelength ranging from 445 nm to 467 nm will be reflected by the reflective filter layer 103 back into the quantum dot film 101 to excite again the quantum dot material in the quantum dot film 101.

Referring to FIG. 1, taking the LED lamp which is a blue LED as an example, blue light emitted by the LED lamp 102 is incident on the quantum dot film 101, where a part of the blue light excites the red and green quantum dot components in the quantum dot film 101 to generate red and green light. The remaining blue light is transmitted through the quantum dot film 101, and blue light in the preset band among the blue light transmitted through the quantum dot film 101 is reflected by the reflective filter layer 103 back into the quantum dot film 101 to excite again the red and green quantum dot components to thereby improve the utilization ratio of the blue light. Also blue light outside the preset band among the blue light transmitted through the quantum dot film 101 is transmitted through the reflective filter layer 103 and mixed with the red and green light generated as a result of the excitation into white light. There is more blue light to excite the quantum dot material, and also there is more red and green light generated as a result of the excitation, so there is more generated white light, that is, the light emission efficiency of the white light is improved. Moreover in the related art, too much of the blue light is transmitted so that the white light generated as a result of the mixing becomes bluish as a whole, whereas in the embodiment of the disclosure, the blue light in the preset band is reflected by the reflective filter layer 103 back into the quantum dot film 101 to further excite the quantum dot material to generate red and green light, so that there is less blue light but more red and green light to be mixed into white light, thus alleviating the white generated as a result of the mixing from being bluish as a whole.

Thus as compared with the related art, the light emitted by the LED lamp in the embodiment of the disclosure is incident on the quantum dot film, so that a part of the light excites the quantum dot material encapsulated in the quantum dot film to generate the light in the complementary colors to the light, and the remaining light is transmitted through the quantum dot film, where when the light transmitted through the quantum dot film is incident on the reflective filter layer, a part of the light excites the quantum dot material encapsulated in the quantum dot film to generate light in the complementary colors to the light, and the remaining light is transmitted through the quantum dot film, where when the light transmitted through the quantum dot film is incident on the reflective filter layer, the light in the present band is reflected by the reflective filter layer back into the quantum dot film, and the light outside the preset band is transmitted directly through the reflective filter layer. The transmitted light is mixed into white light, and the light reflected by the reflective filter layer back into the quantum dot film excites again the quantum dot material in the quantum dot film, so that the light reflected back into the quantum dot film may excite again the quantum dot material to thereby improve the utilization ratio of the light emitted by the LED lamp. Also since the light in the part of the band reflected by the reflective filter layer back into the quantum dot film excites again the quantum dot material, there is more light to excite the quantum dot material, so that more light in the complementary colors may be generated as a result of the excitation, so there is more white light generated as a result of the mixing, that is, the light emission efficiency of the white light is improved. Moreover the light in the part of the band among the light emitted by the LED lamp is reflected by the reflective filter layer, so the white light is generated as a result of the mixing so that there is a lower proportion of the light emitted by the LED lamp, and there is a higher proportion of the light in the complementary colors generated as a result of the excitation, thus alleviating the color cast in the prior art, and improving the light emission effect of the LED light emitting device.

It shall be noted that:

In some embodiments, the LED lamp 102 is a blue LED; and the reflective filter layer 103 is a blue reflective filter layer.

In an application, the red and green quantum dot components may be excited by a blue LED to generate red and green light, or the red, green and blue quantum dot components may be excited by a UV LED to generate red, green and blue light. Since it is less difficult to fabricate the blue LED, and the blue LED may be used without exciting the blue quantum dot component to thereby save the cost of the quantum dot material, the LED lamp 102 is typically embodied as a blue LED; and since the light in the part of the band among the light emitted by the reflective LED lamp 102 is reflected by the reflective filter layer 103, that is, the blue light in the part of the band of the blue LED is reflected by the reflective filter layer 103, the reflective filter layer 103 is a blue reflective filter layer when the LED lamp 102 is a blue LED.

In some embodiments, the reflective filter layer 103 is laminated on the quantum dot film 101.

Since when light propagates in air, photons are absorbed by some substance in the air, thus resulting in a loss of light energy, the reflective filter layer 103 may be laminated on the quantum dot film 101 to thereby shorten a distance over which the light propagates between the reflective filter layer 103 and the quantum dot film 101 so as to lower a loss of light energy between the reflective filter layer 103 and the quantum dot film 101.

In some embodiments, the reflective filter layer 103 is a liquid crystal color filter.

The liquid crystal color filter is a reflective filter sheet complying with the Braggs law. As per the Braggs law, light at a wavelength satisfying $\lambda=2$ nP among incident light is reflected by a multi-layer liquid crystal structure, and all the light at the remaining wavelengths is transmitted, where X represents the wavelength, n represents the average refractive index of the liquid crystals, and P represents a pitch between the liquid crystals. P may vary with the varying temperature, intensity of an electric field, intensity of a magnetic field, and other varying factors, so the wavelength of the light to be reflected may be changed easily by changing the value of P; and the liquid crystal color filter itself is typically nonabsorbent of light and thus highly efficient with making use of light energy, so the reflective filter layer 103 may be embodied as the liquid crystal color filter. Of course, the reflective filter layer 103 in the embodiment of the disclosure may alternatively be embodied as another type of filter sheet, although the embodiment of the disclosure will not be limited thereto as long as the filter sheet may reflect the light in the preset band and transmit the light outside the preset band. For example, the reflective filter layer 103 may alternatively be embodied as an optical thin-film color filter to modulate the amplitude or phase of light propagating in a multi-layer thin film structure to thereby reflect light in some wavelength range and transmit light in the remaining wavelength range.

Figure 2:
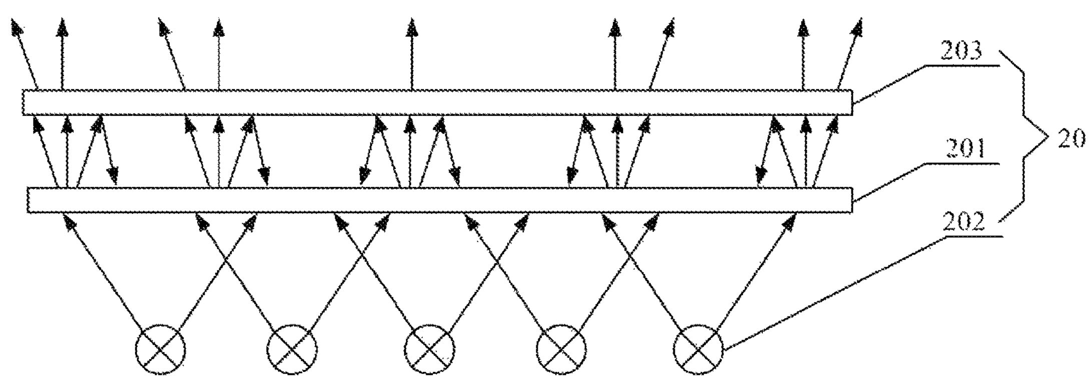
FIG. 2 illustrates a schematic diagram of an LED light emitting device according to some embodiments of the disclosure.

As illustrated in FIG. 2, some embodiments of the disclosure provide an LED light emitting device 20 for a display device, which may include a quantum dot film 201, a reflective filter layer 203, and at least one LED lamp 202, where the quantum dot film 201 is arranged between the LED lamp 202 and the reflective filter layer 203; the at least one LED lamp 202 is configured to emit light to excite a quantum dot material encapsulated in the quantum dot film 201 to generate white backlight; and the reflective filter layer 203 is configured to reflect light in a preset band and to transmit light outside the preset band, where the light in the preset band is light in a part of a band of the light emitted by the LED lamp 202.

Referring to FIG. 2, the LED light emitting device 20 may include a plurality of LED lamps 202, a quantum dot film 201, and a reflective filter layer 203 corresponding to the LED lams 202. The reflective filter layer 203 reflects the light in the preset band among the light emitted by the LED lamps 202 back into the quantum dot film 201 to thereby excite again the quantum dot material so as to improve the utilization ratio of the light emitted by the LED lamps 202. There is more light to excite the quantum dot material, and there is more light in complementary colors generated as a result of the excitation, so more white light may be generated as a result of mixing to thereby improve the light emission efficiency of the white light. Moreover the light in a part of a band among the light emitted by the LED lamps 202 is reflected by the reflective filter layer 203, so the white light is generated as a result of the mixing so that there is a lower proportion of the light emitted by the LED lamps 202, and there is a higher proportion of the light in the complementary colors generated as a result of the excitation, thus alleviating the color cast in the prior art.

Some embodiments of the disclosure provide an LED light emitting device for a display device, which includes a quantum dot film, a reflective filter layer, and at least one LED lamp, where the quantum dot film is arranged between the LED lamp and the reflective filter layer; the at least one LED lamp is configured to emit light to excite a quantum dot material encapsulated in the quantum dot film to generate white backlight; and the reflective filter layer is configured to reflect light in a preset band and to transmit light outside the preset band, where the light in the preset band is light in a part of a band of the light emitted by the LED lamp. As compared with the prior art, the light emitted by the LED lamp in the embodiment of the disclosure is incident on the quantum dot film, so that a part of the light excites the quantum dot material encapsulated in the quantum dot film to generate the light in the complementary colors to the light, and the remaining light is transmitted through the quantum dot film, where when the light transmitted through the quantum dot film is incident on the reflective filter layer, the light in the present band is reflected by the reflective filter layer back into the quantum dot film, and the remaining light outside the preset band is transmitted directly through the reflective filter layer. The transmitted light is mixed into white light, and the light reflected by the reflective filter layer back into the quantum dot film excites again the quantum dot material in the quantum dot film, so that the light reflected back into the quantum dot film may excite again the quantum dot material to thereby improve the utilization ratio of the light emitted by the LED lamp. Also since the light in the band reflected by the reflective filter layer back into the quantum dot film excites again the quantum dot material, there is more light to excite the quantum dot material, so that more light in the complementary colors may be generated as a result of the excitation, so there is more white light generated as a result of the mixing, that is, the light emission efficiency of the white light is improved. Moreover the light in the part of the band among the light emitted by the LED lamp is reflected by the reflective filter layer, so the white light is generated as a result of the mixing so that there is a lower proportion of the light emitted by the LED lamp, and there is a higher proportion of the light in the complementary colors generated as a result of the excitation, thus alleviating the color cast in the prior art, and improving the light emission effect of the LED light emitting device.

Figure 3:
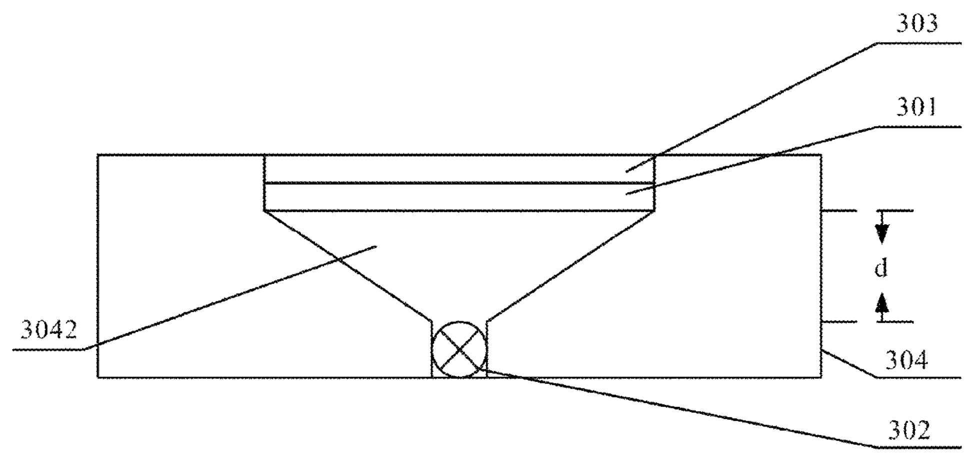
FIG. 3 illustrates a schematic diagram of an LED light emitting device according to some embodiments of the disclosure.

As illustrated in FIG. 3, some embodiments of the disclosure provide an LED light emitting device 30 for a display device, which may include a quantum dot film 301, a reflective filter layer 303, and at least one LED lamp 302, where the quantum dot film 301 is arranged between the LED lamp 302 and the reflective filter layer 303; the at least one LED lamp 302 is configured to emit light to excite a quantum dot material encapsulated in the quantum dot film 301 to generate white backlight; and the reflective filter layer 303 is configured to reflect light in a preset band and to transmit light outside the preset band, where the light in the preset band is light in a part of a band of the light emitted by the LED lamp 302.

Figure 4:
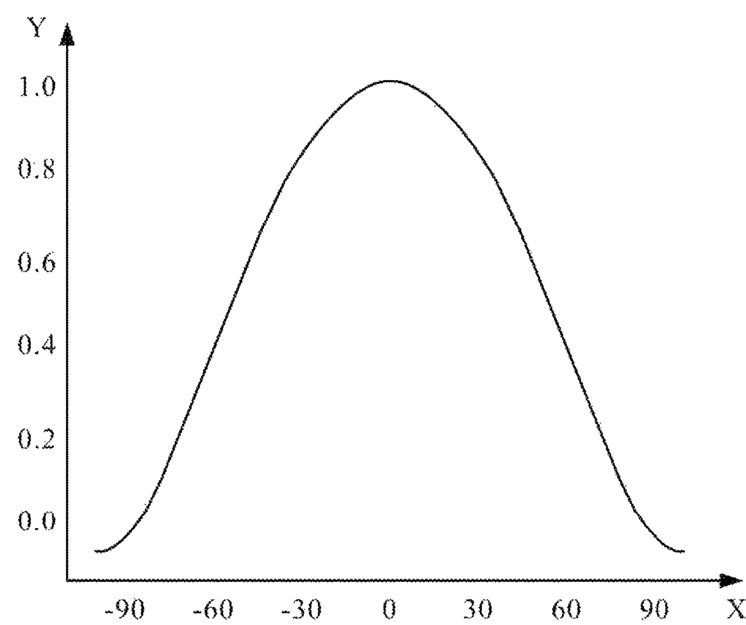
FIG. 4 illustrates a light intensity distribution diagram of an LED lamp according to some embodiments of the disclosure.

Here the reflectivity of the reflective filter layer 303 may be decremented gradually from the center to the edge thereof. Still taking the LED lamp 302 which is a blue LED as an example, FIG. 4 illustrates a distribution of the light intensity of the blue LED at respective angles, where the angle refers to the angle between the normal of the plane where the quantum dot film 301 lies, and light exiting the blue LED, and In FIG. 4, the X axis represents a radiation angle, and the Y axis represents a relative light intensity. Referring to FIG. 4, the light intensity of blue light becomes higher at the angle closer to 0° and lower at the angle further from 0°, that is, the light intensity of the blue light becomes higher in a central area and lower in an edge area, where the central area refers to a area close to the center, and the edge area refers to an area close to the edge. Since the light intensity of the blue LED at the respective angles is distributed differently, the blue light incident on the respective areas of the quantum dot film 301 is also transmitted differently in that the light intensity of the blue light becomes higher, and more of the blue light is transmitted, in the central area, and the light intensity of the blue light becomes lower, and less of the blue light is transmitted, in the edge area, and when the blue light transmitted as such, and red and green light generated as a result of excitation by the blue light is mixed into white light, more of the blue light is transmitted in the central area so that the white light in the central area is more bluish, and less of the blue light is transmitted in the edge area so that the white light in the edge area is less bluish, thus resulting in a color cast of the generated white light. Thus in the embodiment of the disclosure, the reflective filter layer 303 may be arranged above the quantum dot film 301, and the reflectivity of the reflective filter layer 303 may be decremented gradually from the center to the edge thereof, that is, the reflectivity of the reflective filter layer 303 in the central area is high, and the reflectivity of the reflective filter layer 303 in the edge area is low, so more of the blue light transmitted in the central area is lost, and less of the blue light transmitted in the central area is lost, so that the amounts of blue light transmitted in the central area and the edge area tend to be equalized to thereby alleviate the color cast of the white light generated as a result of the mixing.

Referring to FIG. 3, in some embodiments, the LED light emitting device 30 may include a bracket 304 arranged between the quantum dot film 301 and the LED lamp 302 to fix the quantum dot film 301 and the LED lamp 302, to keep a preset distance d between the quantum dot film 301 and the LED lamp 302.

The preset distance d is a distance which may be preset by those skilled in the art experimentally or empirically, although the embodiment of the disclosure will not be limited thereto.

The bracket 304 may be embodied in a number of shapes as long as the quantum dot film 301 and the LED lamp 302 may be fixed to each other, for example, the bracket 304 may be a cuboid, a cube, a cylinder, etc., although the embodiment of the disclosure will not be limited thereto.

The bracket 304 may fix the quantum dot film 301 and the LED lamp 302 to each other in a number of ways, e.g., through adhering or through embedding or the like, although the embodiment of the disclosure will not be limited thereto. FIG. 3 merely illustrates one of a number of feasible ways.

referring to FIG. 3, the bracket 304 may include a hollow section 3042; and the LED lamp 302 and the quantum dot film 301 may be arranged respectively at two ends of the hollow section 3042 of the bracket 304.

The LED lamp 302 and the quantum dot film 301 may be arranged respectively on the two ends of the hollow section 3042 of the bracket 304, so that all the light emitted by the LED lamp 302 will be incident on the quantum dot film 301 due to an inner wall of the bracket 304 to thereby excite the quantum dot material in the quantum dot film 301 so as to improve the utilization ratio of the light emitted by the LED lamp 302.

As illustrated in FIG. 3, the reflective filter layer 303 may be arranged on the side of the quantum dot film 301 away from the LED lamp 302. The reflective filter layer 303 may or may not be laminated on the quantum dot film 301, although the embodiment of the disclosure will not be limited thereto. FIG. 3 merely illustrates one of the alternatives, and referring to FIG. 3, when the reflective filter layer 303 is laminated on the quantum dot film 301, the reflective filter layer 303 may be fixed on the bracket 304 through adhering.

Referring to FIG. 3, the hollow section 3042 of the bracket 304 may be a truncated cone including an upper surface and a lower surface, where the perimeter of the upper surface may be larger than the perimeter of the lower surface; the LED lamp 302 may be arranged proximate to the lower surface; the quantum dot film 301 may be arranged proximate to the upper surface; and the bracket 304 may include an inner wall, i.e., a side wall of the bracket 304 adjoining the truncated cone, which is configured to reflect light emitted from the quantum dot film 301.

Referring to FIG. 3, the hollow section 3042 of the bracket 304 may be a truncated cone with a larger upper end and a smaller lower end, where the LED lamp 302 may be arranged on the smaller end, and the quantum dot film 301 and the reflective filter layer 303 may be arranged on the larger end. The inner wall of the bracket 304, i.e., the side of the truncated cone, may reflect the light emitted from the quantum dot film 301. Still taking the LED lamp 302 which is a blue LED as an example, the reflective filter layer 303 reflects the blue light in the preset band among the blue light transmitted through the quantum dot film 301 back into the quantum dot film 301, and the blue light outside the preset band is transmitted through the reflective filter layer 303; and the blue light in the part of the band reflected by the reflective filter layer 303 back into the quantum dot film 301 excites again the red and green quantum dot components to generate red and green light, and the red and green light generated as a result of the excitation, and the majority of the blue light reflected by the reflective filter layer 303 back into the quantum dot film 301 and transmitted through the quantum dot film 301 is transmitted to the inner wall of the bracket 304, reflected by the inner wall of the bracket 34, and incident again on the quantum dot film 301, so that the red and green light is transmitted through the quantum dot film 301 and the reflective filter layer 303, and the blue in the part of the band excites again the quantum dot material to generate red and green light, and this process is repeated to thereby excite more red and green light so as to generate more white light to thereby improve the light emission efficiency of the white light. Moreover a divergence angle of the LED lamp 302 may be constrained by the inner wall of the bracket 304 so that more light may be incident on the quantum dot film 301 to thereby improve the utilization ratio of the light.

Figure 5:
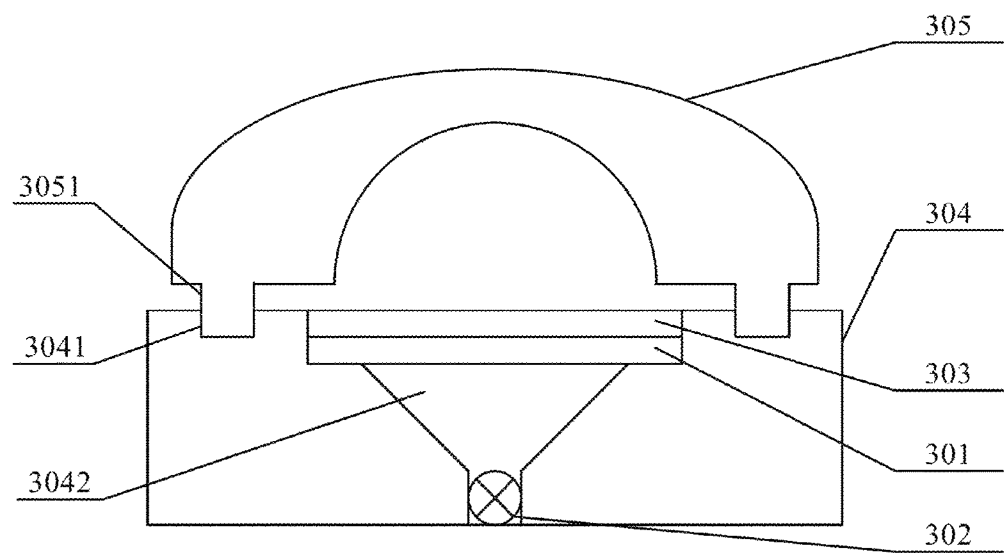
FIG. 5 illustrates a schematic diagram of an LED light emitting device according to some embodiments of the disclosure.

As illustrated in FIG. 5, some embodiments of the disclosure provide an LED light emitting device 30 for a display device, which may include a concave lens 305 arranged on the side of the reflective filter layer 303 away from the quantum dot film 301, which may be configured to diffuse the light emitted from the reflective filter layer 303.

Since the light is diffused by the concave lens, the concave lens 305 may be arranged on the side of the reflective filter layer 303 away from the quantum dot film 301 to extend the angle of the light emitted from the reflective filter layer 303 to thereby expand a spot irradiated onto a diffusion plate so as to improve the uniformity of the light emitted by the backlight module.

Referring to FIG. 5, the bracket 304 may be a hollow column, and the bracket 304 may include an upper surface and a lower surface, where the LED lamp 302 may be arranged proximate to the lower surface, and the upper surface is a surface opposite to the lower surface; at least one buckle 3051 may be arranged on the incidence face of the concave lens 305; at least one groove 3041 is arranged on the upper surface of the bracket 304; and the buckle 3051 is engaged in the groove 3041 to fix the concave lens 305 and the bracket 304 to each other.

A plurality of buckles 3051 may be arranged on the incidence face of the concave lens 305, and a plurality of grooves 3041 may be arranged on the surface of the bracket 304 arranged proximate to the quantum dot film 301, where the particular number of buckles and grooves may be preset particularly for a real application, although the embodiment of the disclosure will not be limited thereto.

The buckle 3051 on the concave lens 305, and the groove 3041 on the bracket 304 may be engaged together directly, or glue may be injected into the groove 3041, and then the buckle 3051 may be placed into the groove 3041 to thereby be fixed, although the embodiment of the disclosure will not be limited to any particular means of fixing the groove 3041 to the buckle 3051, Some embodiments of the disclosure provide an LED light emitting device for a display device, which includes a quantum dot film, a reflective filter layer, and at least one LED lamp, where the quantum dot film is arranged between the LED lamp and the reflective filter layer; the at least one LED lamp is configured to emit light to excite a quantum dot material encapsulated in the quantum dot film to generate white backlight; and the reflective filter layer is configured to reflect light in a preset band and to transmit light outside the preset band, where the light in the preset band is light in a part of a band of the light emitted by the LED lamp. As compared with the prior art, the light emitted by the LED lamp in the embodiment of the disclosure is incident on the quantum dot film, so that a part of the light excites the quantum dot material encapsulated in the quantum dot film to generate the light in the complementary colors to the light, and the remaining light is transmitted through the quantum dot film, where when the light transmitted through the quantum dot film is incident on the reflective filter layer, the light in the present band is reflected by the reflective filter layer back into the quantum dot film, and the light outside the preset band is transmitted directly through the reflective filter layer. The transmitted light is mixed into white light, and the light reflected by the reflective filter layer back into the quantum dot film excites again the quantum dot material in the quantum dot film, so that the light reflected back into the quantum dot film may excite again the quantum dot material to thereby improve the utilization ratio of the light emitted by the LED lamp. Also since the light in the part of the band reflected by the reflective filter layer back into the quantum dot film excites again the quantum dot material, there is more light to excite the quantum dot material, so that more light in the complementary colors may be generated as a result of the excitation, so there is more white light generated as a result of the mixing, that is, the light emission efficiency of the white light is improved. Moreover the light in the part of the band among the light emitted by the LED lamp is reflected by the reflective filter layer, so the white light is generated as a result of the mixing so that there is a lower proportion of the light emitted by the LED lamp, and there is a higher proportion of the light in the complementary colors generated as a result of the excitation, thus alleviating the color cast in the prior art, and improving the light emission effect of the LED light emitting device.

Some embodiments of the disclosure provide a backlight module which may include at least one LED light emitting device which may be any one of the LED light emitting device above.

Figure 6:
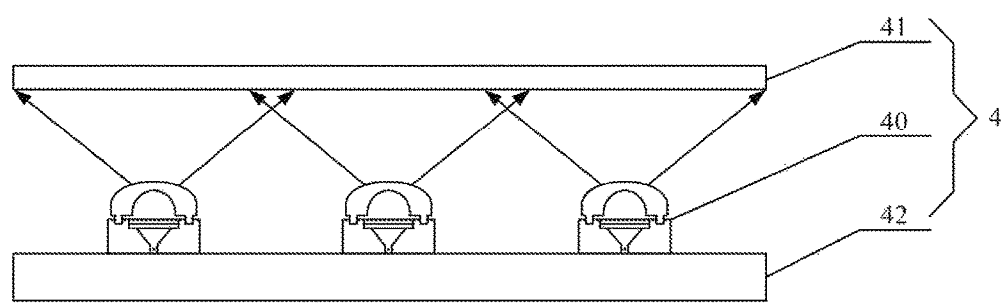
FIG. 6 illustrates a schematic diagram of a backlight module according to some embodiments of the disclosure.

As illustrated in FIG. 6, the backlight module 4 may include an LED light emitting device 40, a diffusion plate 41, and a Printed Circuit Board (PCB) 42, where the LED light emitting device 40 may be arranged between the PCB 42 and the diffusion plate 41. The LED light emitting device 40 may be soldered on the PCB 42 through a pad, and white light emitted by the LED light emitting device 40 may be irradiated onto the diffusion plate 41; and the reflective filter layer may be arranged in the LED light emitting device 40 so that there is more white light emitted from the LED light emitting device 40 to thereby improve the light emission efficiency of the white light so as to improve the light emission efficiency of the backlight module.

Figure 7:
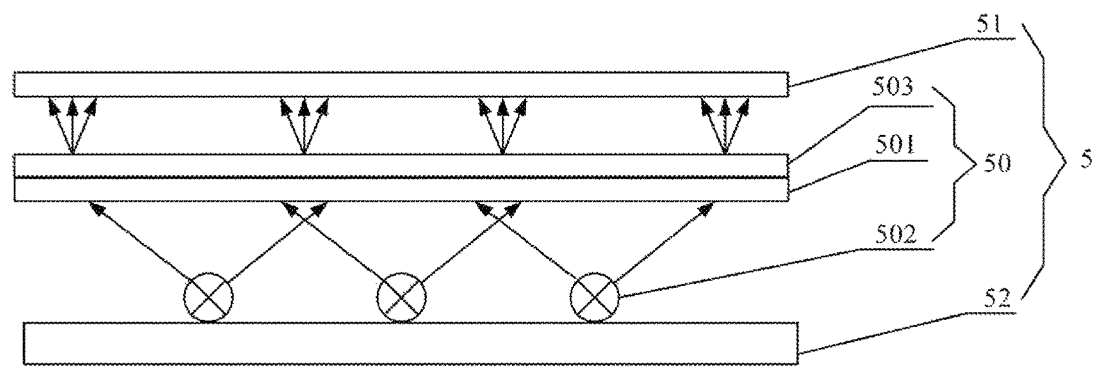
FIG. 7 illustrates a schematic diagram of a backlight module according to some embodiments of the disclosure.

In some embodiments, the backlight module may be structured as illustrated in FIG. 7, where the backlight module 5 may include an LED light emitting device 50, a diffusion plate 51, and a PCB 52, where the LED light emitting device 50 may include a plurality of LED lamps 502, a quantum dot film 501, and a reflective filter layer 503 corresponding to the LED lams 502. The reflective filter layer 503 reflects a part of the light emitted by the LED lamps 502 back into the quantum dot film 501 to thereby excite again the quantum dot material so as to generate more white light to thereby improve the light emission efficiency of the white light.

Some embodiments of the disclosure provide a backlight module including at least one LED light emitting device which may be any one of the LED light emitting device above. the light emitted by the LED lamp in some of the embodiment of the disclosure is incident on the quantum dot film, so that a part of the light excites the quantum dot material encapsulated in the quantum dot film to generate the light in the complementary colors to the light, and the remaining light is transmitted through the quantum dot film, where when the light transmitted through the quantum dot film is incident on the reflective filter layer, the light in the preset band is reflected by the reflective filter layer back into the quantum dot film, and the light outside the preset band is transmitted directly through the reflective filter layer. The transmitted light is mixed into white light, and the light reflected by the reflective filter layer back into the quantum dot film excites again the quantum dot material in the quantum dot film, so that the light reflected back into the quantum dot film may excite again the quantum dot material to thereby improve the utilization ratio of the light emitted by the LED lamp. Also since the light in the part of the band reflected by the reflective filter layer back into the quantum dot film excites again the quantum dot material, there is more light to excite the quantum dot material, so that more light in the complementary colors may be generated as a result of the excitation, so there is more white light generated as a result of the mixing, that is, the light emission efficiency of the white light is improved. the light in the part of the band among the light emitted by the LED lamp is reflected by the reflective filter layer, so the white light is generated as a result of the mixing so that there is a lower proportion of the light emitted by the LED lamp, and there is a higher proportion of the light in the complementary colors generated as a result of the excitation, thus alleviating the color cast in the prior art, and improving the light emission effect of the LED light emitting device.

Some embodiments of the disclosure provide a display device which may include a backlight module and a display panel, where the backlight module may be any one of the backlight modules above.

Figure 8:
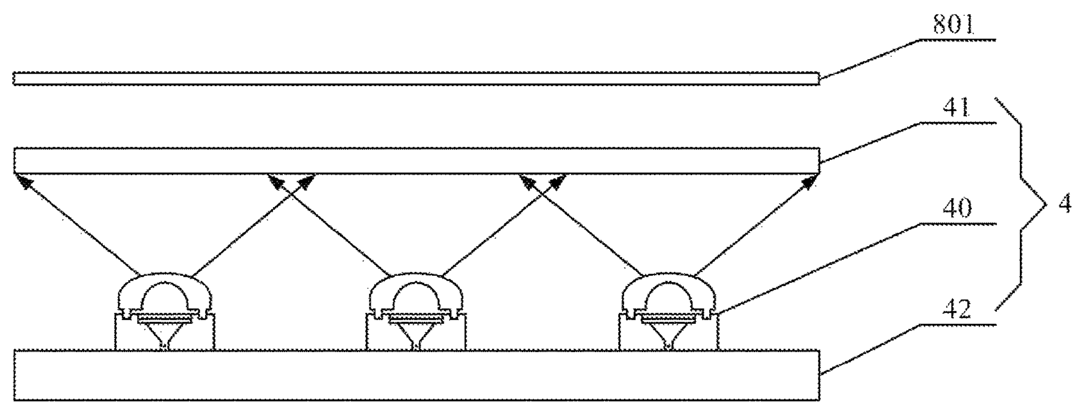
FIG. 8 illustrates a schematic diagram of a display device according to some embodiments of the disclosure.

As illustrated in FIG. 8, some embodiments of the disclosure provide a display device which may include the backlight module 4 as illustrated in FIG. 6, a panel 801, etc., where the backlight module 4 may include an LED light emitting device 40, a diffusion plate 41, and a Printed Circuit Board (PCB) 42, and the LED light emitting device 40 may be arranged between the PCB 42 and the diffusion plate 41. The LED light emitting device 40 typically may be soldered on the PCB 42 through a pad, and white light emitted by the LED light emitting device 40 may be irradiated onto the diffusion plate 41; and the reflective filter layer may be arranged in the LED light emitting device 40 so that there is more white light emitted from the LED light emitting device 40 to thereby improve the light emission efficiency of the white light so as to improve the light emission efficiency of the backlight module.

Figure 9:
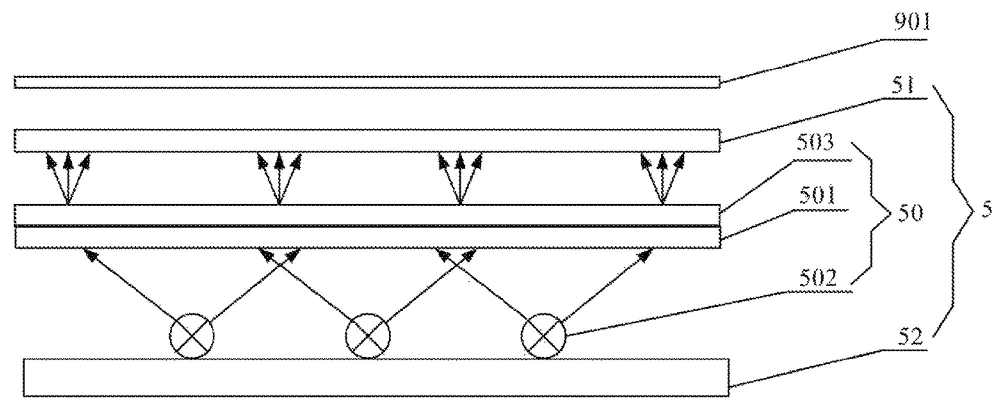
FIG. 9 illustrates a schematic diagram of a display device according to some embodiments of the disclosure.

As illustrated in FIG. 9, some embodiments of the disclosure provide a display device which may include the backlight module 5 as illustrated in FIG. 7, a panel 901, etc., where the backlight module 5 may include an LED light emitting device 50, a diffusion plate 51, and a PCB 52, where the LED light emitting device 50 may include a plurality of LED lamps 502, a quantum dot film 501, and a reflective filter layer 503 corresponding to the LED lams 502. The reflective filter layer 503 reflects a part of the light emitted by the LED lamps 502 back into the quantum dot film 501 to thereby excite again the quantum dot material so as to generate more white light to thereby improve the light emission efficiency of the white light.

Figure 10:
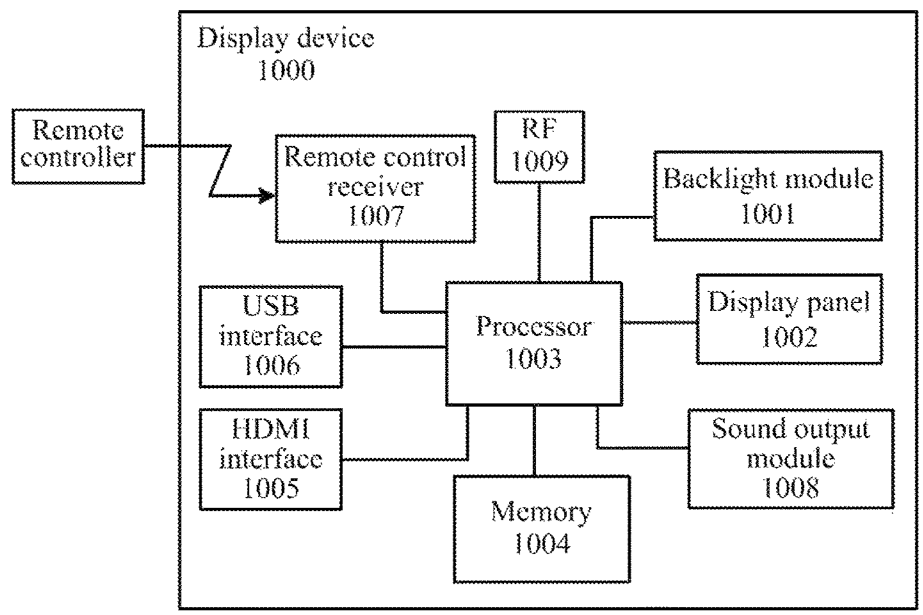
FIG. 10 illustrates a schematic diagram of a particular structure of a display device according to some embodiments of the disclosure.

FIG. 10 illustrates a schematic structural diagram of a display device 1000 according to some embodiments of the disclosure, and as illustrated in FIG. 10, in addition to a backlight module 1001 according to any one of the embodiments above of the disclosure, the display device 1000 according to some embodiments of the disclosure may include at least one processor 1003, at least one memory 1004, at least one input unit, and at least one output unit. Those ordinarily skilled in the art shall appreciate that the display device 1000 according to some embodiments of the disclosure will not be limited to the structure as illustrated in FIG. 10 but may include more or less components than those as illustrated or some of the components may be combined or different components may be configured for different applications of the display device 1000.

The memory 1004 may be configured to store software programs and modules, and the processor 1003 is configured to run the software programs and modules stored in the memory 1004 to thereby perform various function applications and data processes. The memory 1004 may include a high-speed random access memory and may include a nonvolatile memory, e.g., at least one magnetic-disk memory device, a flash memory device or another volatile solid memory device. The memory 1004 may include a memory controller configured to provide an access of the processor and the input unit to the memory 1004.

The processor 1003 is a control center of the display device 1000 and has the respective components of the entire display device 1000 connected by various interfaces and lines. The processor 1003 may run or execute the software programs and/or modules stored in the memory 1004 and invoke the data stored in the memory 1004 to perform the various functions of the display device 1000 and process the data to thereby manage and control the display device 1000 as a whole. The processor 1003 may include one or more processing cores. The processor 103 may be integrated with an application processor and a modem processor, where the application processor generally handles an operating system, user interfaces, applications, etc., and the modem processor generally handles wireless communication. As may be appreciated, the modem processor may not be integrated into the processor 1003.

The input unit may include a TV and radio receiver, a High-Definition Multimedia (HDMI) interface 1005, a USB interface 1006, an audio and video input interface, and a remote controller 1007. Moreover the input unit may include a touch sensitive surface and other input devices, where the touch sensitive surface may be embodied in various types of resistive, capacitive, infrared, surface sound wave and other types, and the other input device may include but will not be limited to one or more of a physical keyboard, functional keys (e.g., volume control press keys, a power-on or-off press key, etc.), a track ball, a mouse, a joystick, etc.

The output unit is configured to output an audio signal, a video signal, an alert signal, a vibration signal, etc. The output unit may include a display panel 1002, a sound output module 1008, etc. The display panel 1002 may be configured to display information input by a user or information provided to the user and various graphic user interfaces of the display device 1000, where these graphic user interfaces may be composed of graphics, texts, icons, videos and any combination thereof. For example, the display panel may be embodied as a Liquid Crystal Display (LCD), an Organic Light-Emitting Diode (OLED), a flexible display, a 3D display, a CRT, a plasmas display panel, etc.

The display device 1000 may include at least one sensor (not illustrated), e.g., an optical sensor, a motion sensor and other sensors. Particularly the optical sensor may include an ambient optical sensor and a proximity sensor, where the ambient optical sensor may adjust the brightness of the display panel 1002 according to the luminosity of ambient light rays, and the proximity sensor may power off the display panel and/or a backlight when the display device 1000 moves to some position. The display device 1000 may be configured with a gyroscope, a barometer, a hygrometer, a thermometer, an infrared sensor and other sensors.

The display device 1000 may include an audio circuit (not illustrated), and a speaker and a transducer may provide an audio interface between the user and the display device 1000. The audio circuit may convert received audio data into an electric signal and transmit the electric signal to the speaker, which is converted by the speaker into an audio signal for output; and on the other hand, the transducer converts a collected audio signal into an electric signal which is received by the audio circuit and then converted into audio data, and the audio data is output to the processor 1003 for processing and then transmitted to another terminal, for example, or the audio data is output to the memory 1004 for further processing. The audio circuit may further include an earphone jack for communication between a peripheral earphone and the display device 1000.

Moreover the display device 1000 may further include a Radio Frequency (RF) circuit 1009. The RF circuit 1009 may be configured to receive and transmit a signal. Typically the RF circuit 1009 includes but will not be limited to an antenna, at least one amplifier, a tuner, one or more oscillators, a Subscriber Identifier Module (SIM) card, a transceiver, a coupler, a Low Noise Amplifier (LNA), a duplexer, etc. Moreover the display device 1000 may further include a web cam, a Bluetooth module, etc.

Moreover the display device 1000 may further include a Wireless Fidelity (WiFi) module (not illustrated). The WiFi falls into the category of short-range wireless transmission technologies, and the display device 1000 may assist the user in receiving and transmitting an e-mail, browsing a webpage, accessing streaming media, etc., through the WiFi module by which the user is provided with a wireless access to the broadband Internet. Although the WiFi module is illustrated in FIG. 10, it may be appreciated that it may not be necessarily required for the display device 1000 but may be omitted as desired without departing from the scope of the disclosure.

As compared with the prior art, the light emitted by the LED lamp in the embodiments of the disclosure is incident on the quantum dot film, so that a part of the light excites the quantum dot material encapsulated in the quantum dot film to generate the light in the complementary colors to the light, and the remaining light is transmitted through the quantum dot film, where when the light transmitted through the quantum dot film is incident on the reflective filter layer, the light in the present band is reflected by the reflective filter layer back into the quantum dot film, and the light outside the preset band is transmitted directly through the reflective filter layer. The transmitted light is mixed into white light, and the light reflected by the reflective filter layer back into the quantum dot film excites again the quantum dot material in the quantum dot film, so that the light reflected back into the quantum dot film may excite again the quantum dot material to thereby improve the utilization ratio of the light emitted by the LED lamp. Also since the light in the part of the band reflected by the reflective filter layer back into the quantum dot film excites again the quantum dot material, there is more light to excite the quantum dot material, so that more light in the complementary colors may be generated as a result of the excitation, so there is more white light generated as a result of the mixing, that is, the light emission efficiency of the white light is improved. Moreover the light in the part of the band among the light emitted by the LED lamp is reflected by the reflective filter layer, so the white light is generated as a result of the mixing so that there is a lower proportion of the light emitted by the LED lamp, and there is a higher proportion of the light in the complementary colors generated as a result of the excitation, thus alleviating the color cast in the prior art, and improving the light emission effect of the LED light emitting device.

The foregoing disclosure is merely illustrative of the particular embodiments of the disclosure, but the claimed scope of the disclosure will not be limited thereto, and any variations or alternatives which may readily occur to those skilled in the art without departing from the scope of the disclosure as disclosed here shall be encompassed in the scope of the disclosure as claimed which shall be as defined in the appended claims.

The invention claimed is:

1. An LED light emitting device for a display device, the LED light emitting device comprising a quantum dot film, a reflective filter layer, and at least one LED, wherein:

the at least one LED is a blue LED that is configured to emit a blue light that is directly incident on the quantum dot film to excite a quantum dot material encapsulated in the quantum dot film to generate white backlight; and the quantum dot film is arranged between the at least one LED and the reflective filter layer, the reflective filter layer is configured to reflect light of the blue light that is in a first preset band and to transmit light of the blue light that is in a second band outside the first preset band and to transmit light excited from the quantum dot film.

2. The LED light emitting device according to claim 1, wherein:

the LED light emitting device comprises one LED; and a reflectivity of the reflective filter layer is decremented gradually from a center to an edge thereof.

3. The LED light emitting device according to claim 2, wherein:

the LED light emitting device further comprises a bracket arranged between the quantum dot film and the at least one LED to fix the quantum dot film and the LED to keep a preset distance between the quantum dot film and the LED.

4. The LED light emitting device according to claim 3, wherein:

the bracket comprises a hollow section; and the LED and the quantum dot film are arranged respectively at two ends of the hollow section.

5. The LED light emitting device according to claim 4, wherein:

the hollow section of the bracket is a truncated cone;

the truncated cone comprises an upper surface and a lower surface, wherein a perimeter of the upper surface is larger than a perimeter of the lower surface;

the LED is arranged proximate to the lower surface, and the quantum dot film is arranged proximate to the upper surface; and the bracket further comprises an inner wall configured to reflect light emitted from the quantum dot film.

6. The LED light emitting device according to claim 5, wherein:

the LED light emitting device further comprises a concave lens; and the concave lens is arranged on a side of the reflective filter layer away from the quantum dot film to diffuse the light emitted from the reflective filter layer.

7. The LED light emitting device according to claim 6, wherein:

the bracket is a hollow column, the bracket comprises an upper surface and a lower surface, the LED is arranged proximate to the lower surface, and the upper surface is a surface opposite to the lower surface;

at least one buckle is arranged on an incidence face of the concave lens;

at least one groove is arranged on the upper surface of the bracket; and the buckle is engaged in the groove to fix the concave lens and the bracket to each other.

8. The LED light emitting device according to claim 1, wherein the reflective filter layer is laminated on the quantum dot film.

9. The LED light emitting device according to claim 1, wherein the reflective filter layer is a liquid crystal color filter.

10. The LED light emitting device according to claim 1, wherein the first preset band is approximately half of a band of the blue light.

11. The LED light emitting device according to claim 1, wherein the first preset band is 445 nm to 467 nm or 467 nm to 490 nm.

12. A display device, comprising a backlight module comprising at least one LED light emitting device, the LED light emitting device comprising a quantum dot film, a reflective filter layer, and at least one LED, wherein:

the at least one LED is a blue LED that is configured to emit a blue light that is directly incident on the quantum dot film to excite a quantum dot material encapsulated in the quantum dot film to generate white backlight; and the quantum dot film is arranged between the at least one LED and the reflective filter layer, the reflective filter layer is configured to reflect light of the blue light that is in a first preset band and to transmit light of the blue light that is in a second band outside the first preset band and to transmit light excited from the quantum dot film.

13. The display device according to claim 12, wherein:

the LED light emitting device comprises one LED; and a reflectivity of the reflective filter layer is decremented gradually from a center to an edge thereof.

14. The display device according to claim 13, wherein:

the LED light emitting device further comprises a bracket arranged between the quantum dot film and the LED to fix the quantum dot film and the at least one LED lamp to keep a preset distance between the quantum dot film and the LED.

15. The display device according to claim 14, wherein:

the bracket comprises a hollow section; and the LED and the quantum dot film are arranged respectively at two ends of the hollow section.

16. The display device according to claim 15, wherein:

the hollow section of the bracket is a truncated cone;

the truncated cone comprises an upper surface and a lower surface, wherein a perimeter of the upper surface is larger than a perimeter of the lower surface;

the LED is arranged proximate to the lower surface, and the quantum dot film is arranged proximate to the upper surface; and the bracket further comprises an inner wall configured to reflect light emitted from the quantum dot film.

17. The display device according to claim 16, wherein:

the LED light emitting device further comprises a concave lens; and the concave lens is arranged on a side of the reflective filter layer away from the quantum dot film to diffuse the light emitted from the reflective filter layer.

18. The display device according to claim 17, wherein:

the bracket is a hollow column, the bracket comprises an upper surface and a lower surface, the LED is arranged proximate to the lower surface, and the upper surface is a surface opposite to the lower surface;

at least one buckle is arranged on an incidence face of the concave lens;

at least one groove is arranged on the upper surface of the bracket; and the buckle is engaged in the groove to fix the concave lens and the bracket to each other.

19. The display device according to claim 12, wherein the reflective filter layer is laminated on the quantum dot film.

20. The display device according to claim 12, wherein the reflective filter layer is a liquid crystal color filter.

* * * * *